(12) United States Patent
Pizzuto et al.

(10) Patent No.: US 6,373,311 B1
(45) Date of Patent: Apr. 16, 2002

(54) OSCILLATOR AND SWITCH-OVER CONTROL CIRCUIT FOR A HIGH-VOLTAGE GENERATOR

(75) Inventors: Olivier Pizzuto, Lot. de Louvère; François Pierre Tailliet, Epinay sur Seine, both of (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/578,778

(22) Filed: May 25, 2000

Related U.S. Application Data (62) Division of application No. 08/995,667, filed on Dec. 22, 1997, now Pat. No. 6,147,566.

(30) Foreign Application Priority Data

Dec. 30, 1996 (FR) .............................................. 96 16355

(51) Int. Cl.[7] .................................................. H03K 3/00
(52) U.S. Cl. ........................ 327/259; 327/165; 327/296
(58) Field of Search ................................ 327/295, 296, 327/165, 175, 259, 258

(56) References Cited

U.S. PATENT DOCUMENTS

| 3,854,103 A | 12/1974 | Takarada ..................... 331/55 |
| 4,868,525 A | 9/1989 | Dias ............................ 331/111 |
| 5,105,169 A | 4/1992 | Yamazaki et al. ............. 331/34 |
| 5,111,066 A | * 5/1992 | Artieri et al. ................. 327/259 |
| 5,124,572 A | * 6/1992 | Mason et al. ................. 327/259 |
| 5,153,534 A | 10/1992 | Ruetz .......................... 331/111 |
| 5,532,653 A | 7/1996 | Adkins ........................ 331/143 |
| 5,589,793 A | 12/1996 | Kassapian .................... 327/536 |
| 5,592,115 A | 1/1997 | Kassapian .................... 327/239 |
| 5,710,527 A | 1/1998 | Yaguchi et al. ............... 331/57 |
| 5,760,638 A | * 6/1998 | Brigati et al. ................ 327/259 |

FOREIGN PATENT DOCUMENTS

EP    0 591 022    4/1994

OTHER PUBLICATIONS

Ramesh Patnaikuni et al, Design and Analysis of an Optical-powered On-chip Power Supply, Aug. 14–16, 1989 pp. 681–684, IEEE vol. 2, Symp 32.

* cited by examiner

*Primary Examiner*—Jung Ho Kim
(74) *Attorney, Agent, or Firm*—Wolf, Greenfield & Sacks, P.C.; James H. Morris (57) ABSTRACT

An oscillator circuit produces first and second oscillating logic signals that are of a same frequency and are non-overlapping in a first logic state. This oscillator includes a flip-flop circuit to produce third and fourth oscillating logic signals of opposite polarities, this flip-flop circuit being driven by first and second driving logic signals. First and second logic gates receive the third and fourth logic signals and produce the first and second logic signals, the logic state transitions in the first and second logic signals being produced as a function of the logic state transitions of the third and fourth logic signals. The first and second logic gates are organized so as to introduce a delay into the transitions from a second logic state to the first logic state, in the first and second logic signals, with respect to transitions in the third and fourth logic signals. First and second RC type circuits produce the first and second driving signals to control the transitions in the third and fourth logic signals. The oscillator circuit can be used in a switch-over control circuit for a load pump type of high-voltage generator.

10 Claims, 6 Drawing Sheets

FIG. 3A  FX  VCC

FIG. 3B  FBX  Vb

FIG. 3C  FN  VCC

FIG. 3D  FBN  Vb

OSCILLATOR AND SWITCH-OVER CONTROL CIRCUIT FOR A HIGH-VOLTAGE GENERATOR

This application is a division of application Ser. No. 08/995,667, filed Dec. 22, 1997, entitled AN OSCILLATOR AND SWITCH-OVER CONTROL CIRCUIT FOR A HIGH-VOLTAGE GENERATOR, now U.S. Pat. No. 6,147,566.

BACKGROUND OF THE INVENTION

1. Field of the Invention

The present invention relates to the field of oscillators. It can be applied in the field of electronic circuits that are supplied by a voltage, where it is necessary to produce a voltage greater than its supply voltage.

2. Description of the Related Art

A typical example of the application of a circuit using a voltage greater than its supply voltage is that of integrated circuits incorporating non-volatile memories that use floating-gate transistors. The programming of these memories requires a programming voltage (in the range of 18 volts) which is far greater than the normal supply voltage (typically ranging from 2 to 5 volts). So that the user may use this memory with only one external supply voltage, it is planned that the integrated circuit will possess internal means to produce the programming voltage from the supply voltage. The circuit that will produce the programming voltage is a high-voltage generator circuit whose principle is generally based on that of the "load pump".

Figure 1:
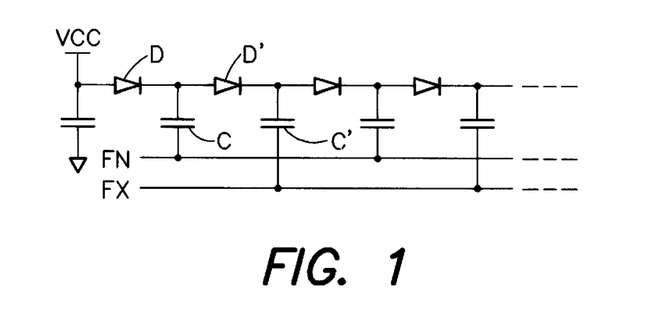
FIG. 1 shows a load pump using diodes and capacitors.
Figure 3A:
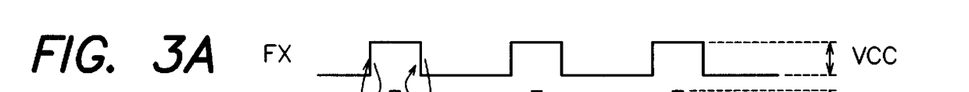
FIG. 3 shows the phases associated with the load pump of FIG. 2.
Figure 3B:
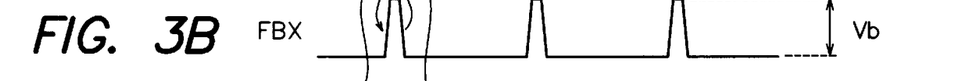
Figure 3C:
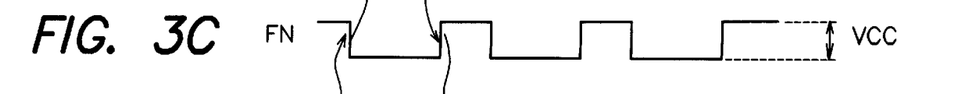

The schematic diagram of the load pump is shown in FIG. 1. The load pump has a succession of stages of diodes D and capacitors C, with switches to switch over the connections of the capacitors between a supply voltage VCC and a ground according to two periodic driving signals, also called phases, FN, FX that are non-overlapping, as illustrated in FIGS. 3C and 3A, respectively. Each stage has two capacitors C, C' and two diodes D, D'. In the first phase FN, the first capacitor C is charged at the supply voltage VCC. In the second phase FX, the first capacitor C is partially discharged into the second capacitor C'. Then the first capacitor C is again charged. The diodes D, D' prevent the discharging of the second capacitor C' into the first capacitor C so that gradually this second capacitor C' will have the voltage at its terminals rise up to a value which, in theory, may attain 3*VCC (if one does not take account the voltage drops in the diodes). To obtain a higher voltage, n successive stages are series-connected. Accounting for the threshold voltage Vt of the diodes, the voltage obtained may be (n+1)*(VCC−Vt).

Figure 2:
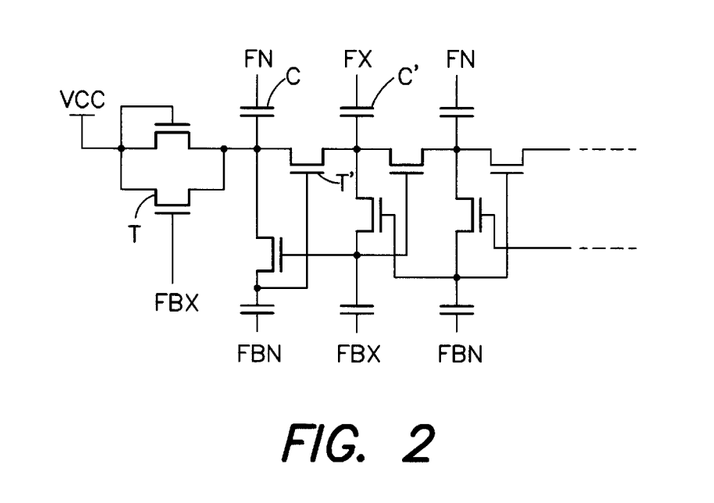
FIG. 2 shows a load pump using transistors and capacitors.

To obtain a sufficient value of output voltage without excessively increasing the number of stages, it has already been proposed to limit the losses by replacing the diodes D and D' with transistors T, T' that do not create a voltage drop at their terminals when they are conductive. The diagram that may result therefrom is shown in FIG. 2. Since the transistors also have a threshold voltage Vt, it is planned that certain transistors will have their control gate controlled by a voltage level greater, by at least the value Vt, than the voltage that they should let through. Thus, with n load pump stages, there is obtained an output voltage which may reach (n+1)*VCC. This value is more advantageous than in the aforementioned diode circuits.

Figure 3D:
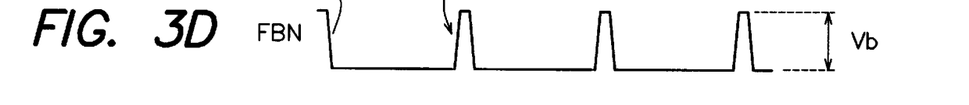

In practice, the diagram of the load pump of FIG. 2 shows two pairs of driving signals or phases. These are, firstly, FN and FX as in FIG. 1, switching over between two voltage levels 0 and VCC and, secondly, FBN and FBX which are respectively synchronized with FN and FX but which switch over between two voltage levels 0 and Vb (the signals FBX and FBN are illustrated in FIGS. 3B and 3D) where Vb is the highest possible voltage level (which will depend on the number of stages, and more specifically on the maximum voltage that has to flow through the transistors). However, care must be taken to limit the value of Vb so as not to disrupt the gate oxides of the transistors. The signals FBN and FBX are generally produced from the signals FN and FX, by using the charge of the capacitors to artificially raise (i.e. to bootstrap) the level VCC and reach the level Vb. The signals are then called bootstrapped signals.

The European patent application 0 591 022 A1 describes a load pump of this kind.

One solution for producing such non-overlapping phases uses an oscillator that produces a basic clock signal. It is possible to use a ring oscillator, typically formed by looped logic gates or an RC type relaxation oscillator. The basic signal is used to produce non-overlapping phases, generally by using sets of looped logic gates (these gates, in the ring oscillators, could be integrated into the loop producing the basic signal). In practice, however, it is difficult with a system of this kind to obtain appropriate symmetry and to guarantee non-overlapping of the phases produced. Additionally, in practice, phases with different duty cycles are produced, and a partial overlapping of the phases, or at least a margin of non-overlapping that is small, can be seen. In certain cases, the production of the phases or the production of unusable phases is stopped, since their duty cycles or their margin of non-overlapping is not suited to the application being sought. Finally, this type of circuit generally requires a large number of components and therefore raises a problem of space requirements and power consumption.

When a load pump is used, it is always useful to ensure that the voltage produced reaches the desired value as fast as possible. In other words, it is necessary to produce phases having the highest possible frequency, since it is the frequency of the phases that conditions the build-up time of the pump.

One problem with this type of circuit is that the oscillation frequency is a direct function of the value of the supply voltage. Indeed, the production of the phases is typically obtained by means of logic gates whose switch-over time is a function of their supply voltage. Now, there is a growing trend towards the designing of circuits that can be used with a supply voltage that is within a certain range, for example between 1.5 (or less) and 5.0 volts and no longer with a given supply voltage. To the minimum supply voltage there will correspond the lowest frequency of the pump. To the maximum supply voltage there will correspond the highest frequency of the pump. It would be difficult to obtain a compromise providing for minimum frequency of appreciable value while at the same time avoiding an excessively high maximum frequency and preventing a situation where the circuit shows, for example, problems of electromagnetic radiation.

One solution includes producing the phases by means of an external clock signal with a stable frequency that is independent of the variations in the supply voltage. In this case, problems of radiation, if any, will be averted but it will be necessary to set the frequency as a function of the minimum supply voltage. Indeed, the minimum supply voltage corresponds to the slowest sequencing of the phases. If the frequency of the external oscillator is higher than the permissible limit so that the phases may be accurately sequenced, then the system will "stall", in other words, it will become desynchronized and stop functioning. Hence, the build-up time of the pump will be limited for higher supply voltages that would enable operation at a higher phase-sequencing frequency.

Another approach is to provide for a load pump diagram by which it is possible not to limit the phase sequencing frequency to its maximum permissible value at minimum supply voltage, while at the same time limiting this frequency from a given supply voltage threshold value onwards. For low supply voltages, the frequency increases with the supply voltage. In other words, it is the inherent phase sequencing speed that conditions the frequency of the pump. Starting from a given supply voltage threshold, the frequency is limited to a given value. The frequency of the pump is then independent of the supply voltage and it is the inherent frequency of a relaxation oscillator that conditions the sequencing of the phases.

SUMMARY OF THE INVENTION

The present invention is aimed at providing an oscillator that enables the production of non-overlapping phases of the same frequency and that can provide for improved symmetry and an improved margin of non-overlapping.

Another aim of the present invention is to provide an oscillator that is improved from the viewpoint of space requirements and power consumption.

Another aim of the present invention is to provide an oscillator comprising means to control the frequency of the phases produced.

Thus, the present invention relates to an oscillator producing first oscillating logic signals that are of the same frequency and are non-overlapping in a first logic state. This oscillator comprises a flip-flop circuit to produce second oscillating logic signals of opposite polarities, the flip-flop circuit being driven by first and second driving logic signals. First and second logic gates receive the third and fourth logic signals and produce the first and second logic signals, the logic state transitions in the first and second logic signals being produced as a function of the logic state transitions of the third and fourth logic signals. The first and second logic gates are organized so as to introduce a delay into the transitions, from a second logic state to the first logic state, in the first and second logic signals with respect to transitions in the third and fourth logic signals. First and second RC type circuits produce the first and second driving signals to control the transitions in the third and fourth logic signals.

According to one embodiment, the first and second logic gates producing the first and second logic signals are Schmitt triggers receiving the third and fourth logic signals.

According to one embodiment, the first and second RC type circuits are integrators producing voltages from one of the first and second logic signals, and third logic gates that are sensitive to the values of these voltages produce one of the first and second driving signals, the logic states of these driving signals representing values of the voltages produced.

According to one embodiment, the third logic gates are controlled by control signals enabling changes in logic state in the first and second driving signals to be delayed.

According to one embodiment, the RC type circuits have different time constants so as to produce first and second logic signals having different duty cycles.

The present invention also relates to a switch-over control circuit for a load pump type of high-voltage generator, wherein said circuit comprises, firstly, an oscillator as defined here above, the oscillator producing first and second logic signals and, secondly, output stages receiving the first and second logic signals and repetitively producing first and second driving phases from these first signals.

According to one embodiment, the first and second output stages each produces control signals, the oscillator receiving these control signals and comprising means to control the frequency of the first logic signals so that the frequency of these signals is the smaller of a fixed frequency and a frequency that is variable depending on the driving phases.

According to one embodiment, with the output stages producing first and second non-overlapping driving phases in a first logic state, these first and second driving phases are produced by means of flip-flop circuits driven -by the first and second logic signals.

According to one embodiment, the first and second driving phases are produced by first and second inverters that are cascade-connected respectively, with the first and second flip-flop circuits, each of these inverters being formed by transistors whose channels are series-connected with resistors so as to limit the current flowing through these channels during switch-over phases.

According to one embodiment, the output stages each comprises potential bootstrap circuits to produce respectively, third and fourth driving phases forming, with the first and second driving phases, two pairs of driving phases, the third and fourth phases being produced by bootstrapping the potential corresponding to the first logic state of the first phases and the second phases being used to control the resetting of the flip-flop circuits producing the first and second driving phases.

According to one embodiment, each potential bootstrap circuit comprises at least two cascade-connected potential translator circuits and one precharging circuit, the potential translator circuits producing respectively the third and fourth driving phases by means of capacitors, these capacitors giving a supply potential to supply inputs of said translator circuits, said capacitors being precharged by the precharging circuit during precharging phases and the potentials at the terminals of these capacitors being bootstrapped during bootstrapping phases, and the first translator circuit playing a part in the bootstrapping the potentials of the capacitor supplying the second logic potential translator circuit.

According to one embodiment, the potential translator circuits each produce a potential logic signal from a logic potential bootstrapped received at a control input and the cascade-connected potential translator circuits are driven by one and the same control signal so that the bootstrapped potential signal produced by the second translator circuit is bootstrapped gradually during the bootstrapping phases.

According to one embodiment, the precharging circuit comprises means for the limiting, to a maximum value, during the precharging phases, of the supply potential given to the supply inputs of the potential translator circuits.

According to one embodiment, the precharging circuit comprises transistors and means to control these transistors so as to take the supply potentials of the potential translator circuits, during the precharging phases, to a first value in precharging the capacitors that supply said circuits, and so as to insulate these capacitors, during the bootstrapping phases, from the precharging circuit so as to prevent the discharging of these capacitors into the precharging circuit.

BRIEF DESCRIPTION OF THE DRAWINGS

Other characteristics and advantages of the invention shall appear from the following detailed description made with reference to the appended drawings, of which.

DETAILED DESCRIPTION

Figure 4:
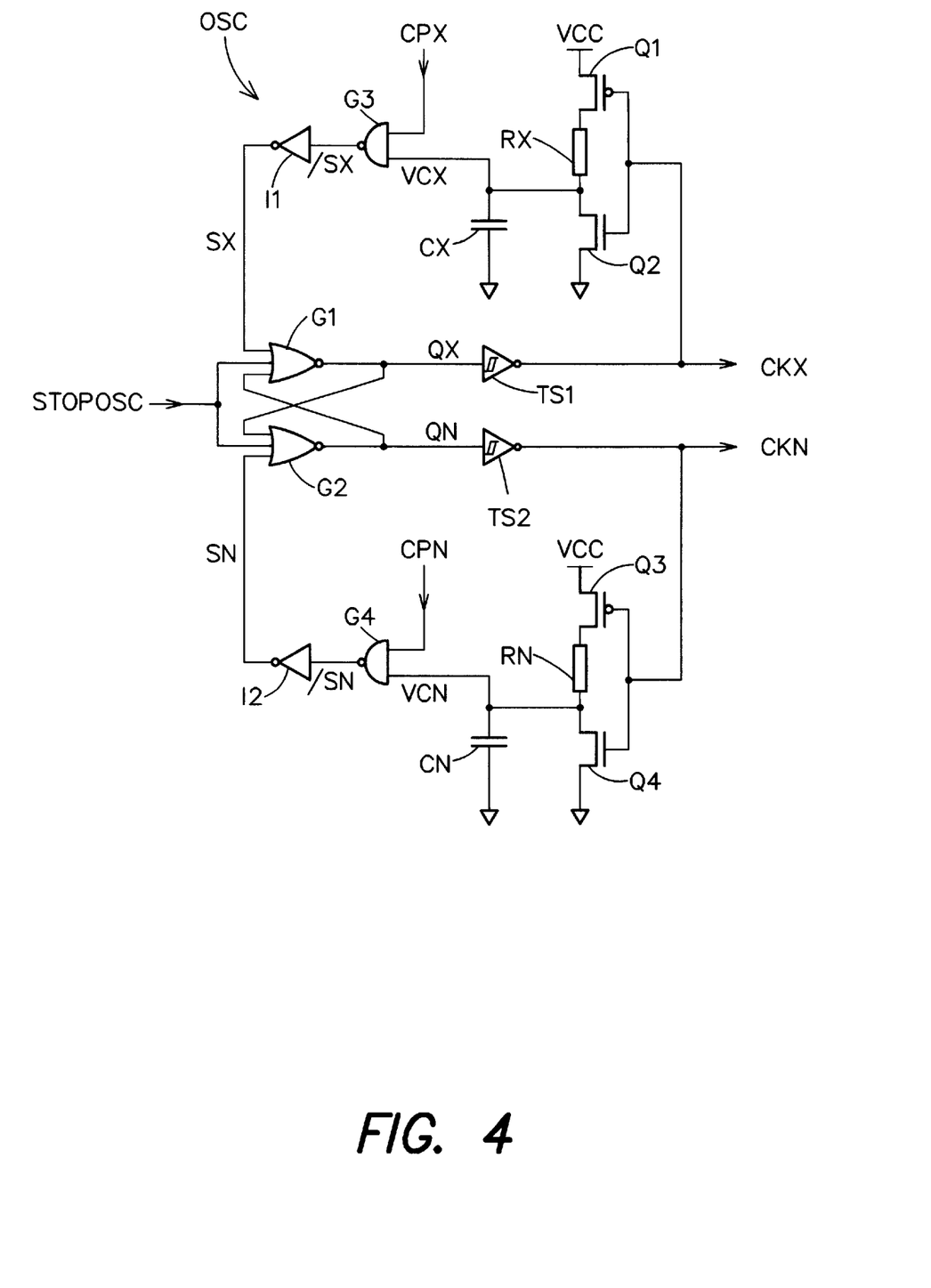
FIG. 4 shows a diagram of an oscillator made according to the present invention.

FIG. 4 shows an exemplary embodiment of an oscillator OSC made according to the present invention. Merely for purposes of description, and not of limitation, it will be assumed that the oscillator is supplied with a positive supply potential VCC and a ground potential.

The circuit OSC is used to produce oscillating logic signals CKX and CKN having the same frequencies and being non-overlapping in a given logic state.

The oscillator OSC receives a control logic signal STOPOSC which is used to turn the oscillator on when STOPOSC is in a first state and to turn it off when STOPOSC is in a second state. It shall be assumed in the example that the first state is a low state (corresponding electrically to the ground potential) and that the second state is a high state (corresponding electrically to the positive supply potential VCC).

Considering, for example, the use of this oscillator to control a load pump type of circuit, the signal STOPOSC will be given, typically, by a regulation device placed at an output of the pump so as to stop the pump when the desired voltage at the output of the pump is reached.

Naturally, it is possible to present additional conditions or conditions that are different for turning the oscillator on or off. It is also possible to make an oscillator that never stops.

The oscillator OSC is a relaxation oscillator. It has two RC type oscillating circuits to produce the signals CKX and CKN so that these signals have identical frequencies and are non-overlapping at the low state.

The oscillator has two NOR type logic gates G1 and G2 forming an RS flip-flop circuit. The gates G1 and G2 are three-input gates. They produce logic signals respectively referenced QX and QN.

At its inputs, the gate G1 receives respectively the signal STOPOSC, the signal QN and a driving logic signal SX. A signal CKX is produced by a hysteresis inverter TS1 (also called a Schmitt trigger) that receives the signal QX.

The signal CKX is given to an integrator that comprises two transistors Q1, Q2, one resistor RX and one capacitor CX. The signal CKX is thus given to the control gates of the P channel MOS type transistor Q1 and the N channel MOS type transistor Q2. The source of the transistor Q1 receives the potential VCC and its drain is connected to a first pole of the supply resistor RX. The source of the transistor Q2 is connected to ground and its drain is connected, firstly, to a second pole of the resistor RX and, secondly, to a first pole of the capacitor CX. The capacitor CX has a second pole connected to ground. The voltage at the first pole of the capacitor CX is referenced VCX.

The signal VCX is provided to a first input of a NAND type logic gate G3 which converts the voltage VCX into a logic signal. The logic gate G3 has a second input that receives a logic signal CPX and an output that produces a signal /SX. An inverter I1 receives the signal /SX and produces the signal SX, which is complementary to the signal /SX.

At its inputs, the gate G2 respectively receives the signal STOPOSC, the signal QX and a driving logic signal SN. The signal CKN is produced by a hysteresis inverter TS2 (also called a Schmitt trigger) which receives the signal QN.

The signal CKN is provided to an integrator that comprises two transistors Q3, Q4, one resistor RN and one capacitor CN. The signal CKN is thus given to the control gates of the P channel MOS type transistor Q3 and the N channel MOS type transistor Q4. The source of the transistor Q3 receives the supply potential VCC and its drain is connected to a first pole of the resistor RN. The source of the transistor Q4 is connected to ground and its drain is connected, firstly, to a second pole of the resistor RN and, secondly, to a first pole of the capacitor CN. The capacitor CN has a second pole connected to ground. The voltage at the first pole of the capacitor CN is referenced VCN.

The signal VCN is given to a first input of a NAND type logic gate G4 that converts the voltage VCN into a logic signal. The NAND gate G4 has a second input that receives a logic signal CPN and an output that produces a signal /SN. An inverter I2 receives the signal /SN and produces the signal SN complementary to the signal /SN.

A description shall now be given of the oscillator OSC, the signals produced in the oscillator OSC being shown in FIGS. 5A to 5I.

Figure 5A:
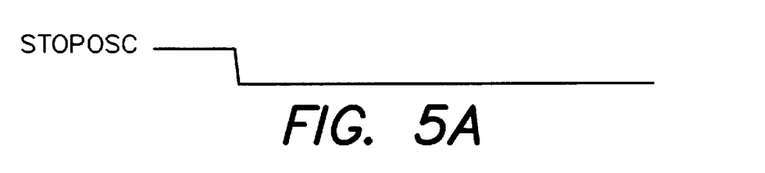
FIGS. 5A to 5I show timing diagrams of signals produced in relation to the oscillator.
Figure 5B:
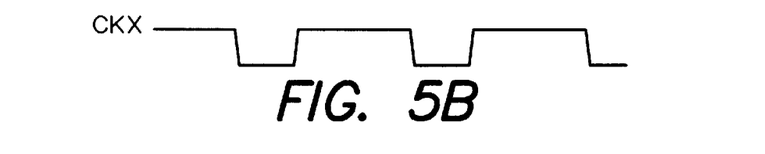
Figure 5C:
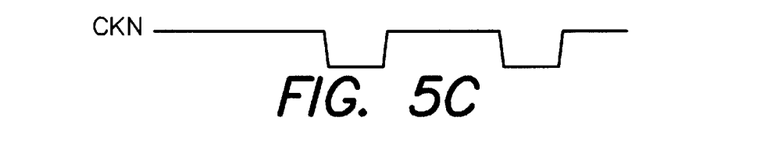
Figure 5D:
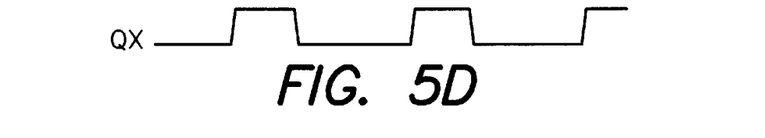
Figure 5E:
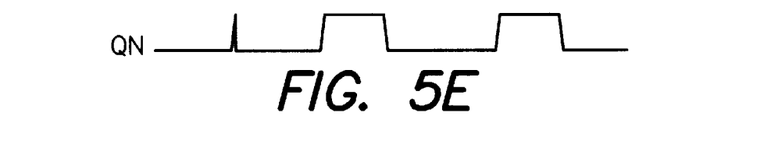
Figure 5F:
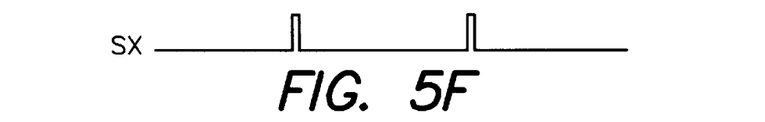
Figure 5G:
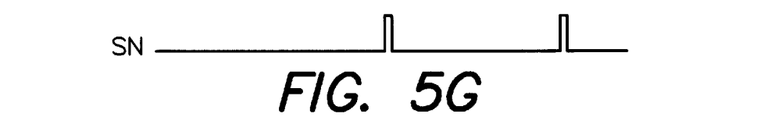
Figure 5H:
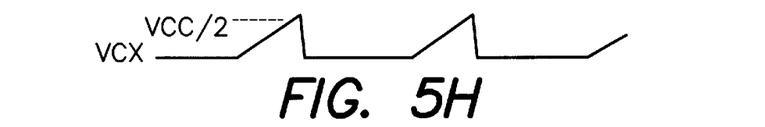
Figure 5I:
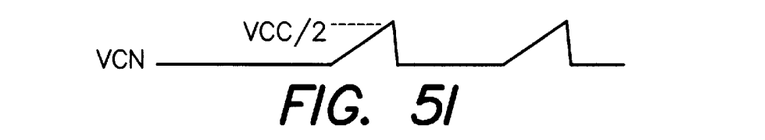

It is assumed that the signal STOPOSC shown in FIG. 5A is initially in the high state (the oscillator is turned off) and that the signals CPX and CPN (not shown) are in the high state (the NAND gates G3 and G4 are then equivalent to inverters).

Initially, the signals CIX and CKN (shown in FIGS. 5B and 5C) are in the high state. The signals QX, QN, SX and SN (shown in FIGS. 5D, 5E, 5F and 5G) are in the low state. The voltages VCX and VCN (shown in FIGS. 5H and 5I) are zero.

When the signal STOPOSC falls to the low state, the signals QX and QN tend to rise to the high state, but this state is unstable, however, the oscillator starts up. Let it be assumed that the signal QX then rises to the high state. The signal QN then falls to the low state. Once the switch-over threshold of the inverter TS1 has been reached by the signal QX, the signal CKX falls to the low state. The capacitor CX then gets charged through the resistor RX and the transistor Q1. When the voltage VCX reaches VCC/2, the signal /SX falls to the low state and the signal SX rises to the high state. This leads to the setting of the flip-flop circuit formed by the gates G1 and G2, resulting in the fall of the signal QX to the low state and, subsequently, the rising of the signal CKX to the high state. The capacitor CX then gets discharged through the transistor Q2, causing the signal SX to fall to the low state.

At the same time, when the signal QX is falling to the low state, the signal QN rises to the high state when the signal QX reaches VCC/2. Once the switch-over threshold of the inverter TS2 has been reached by the signal QN, the signal CKN falls to the low state. The capacitor CN then gets charged through the resistor RN and the transistor Q3. When the voltage VCN reaches VCC/2, the signal ISN falls to the low state and the signal SN rises to the high state. This leads to the resetting of the flip-flop circuit formed by the gates G1 and G2, leading to the fall of the signal QN to the low state and, subsequently, the rising of the signal CKN to the high state. The capacitor CN then gets discharged through the transistor Q4, causing the descent of the signal SN to the low state.

Thus, signals CKX and CKN having an identical frequency are produced. If the values of the resistors RN and RX, on the one hand, and of the capacitors CX and CN, on the other hand, are identical, then the signals CKX and CKN will also have the same duty cycle.

By modifying the values of RX, RN, CX and CN, it is possible to produce same frequency signals that are not overlapping in the low state and which have different duty cycles. This may be valuable, for example, for the production of several reference voltages, through the use of voltage converters producing voltages whose values are regulated as a function of the mean value of the clock signals received. Indeed, an oscillator according to the present invention makes it possible to drive systems sensitive to different duty cycles of clock signals, while at the same time ensuring a general frequency of operation that is a single frequency.

The non-overlapping of the signals CKX and CKN in the low state is ensured by the Schmitt triggers TS1, TS2. The switch-over thresholds of each of these Schmitt triggers are chosen so that they are offset with respect to the switch-over threshold of the gates G1 and G2 which, typically, is located at VCC/2. Thus, the state transitions of the signals CKX and CKN will be given a delay with respect to the transitions of the signals QX and QN.

It is of course possible, with the present oscillator, to produce non-overlapping signals in the high state by using inverters that receive the signals CKX and CKN.

The use of RC circuits to produce the signals CKX and CKN provides for the production of a signal frequency that is stable as a function of the supply voltage, the time constant of the RC circuits being independent of the value of the supply voltage VCC. Furthermore, a signal frequency that is stable as a function of temperature is also produced.

As shall be seen below, the signals CPN and CPX are used, when necessary, to slow down the frequency of the signals CKX and CKN. Indeed, the switch-over of the signals SX and SN, which control the switch-over of the signals produced by the gates G1 and G2, is conditioned by the state of the signals CPX and CPN. If these signals are in the low state, the charges of the capacitors CX and CN have no effect on the signals CKX and CKN. It is possible to make an oscillator without control over the frequency of the signals produced, by replacing the gates G3 and G4 with gates that perform a single inversion and receive the voltages VCX and VCN.

It is also possible to provide an oscillator without using the ON or OFF signal STOPOSC. Then, two-input NOR gates could be used. Of course, the three-input NOR gates G1, G2 could still be used with the input which would have received the STOPOSC signal tied to ground.

It is also possible, of course, without going beyond the scope of the present invention, to modify the polarity of the signals of the oscillator and/or to use different logic gates to implement the operation above described.

Figure 6:
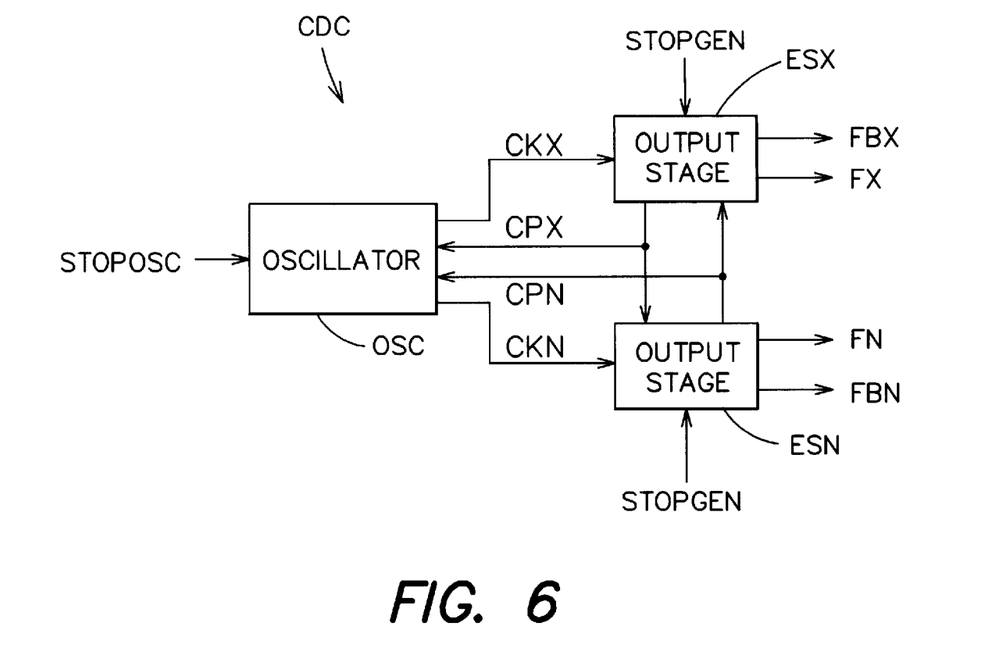
FIG. 6 shows a diagram of a circuit for the production of phases that uses the oscillator according to the present invention and which is capable of controlling a load pump of the type shown with reference to FIG. 2.
Figure 7:
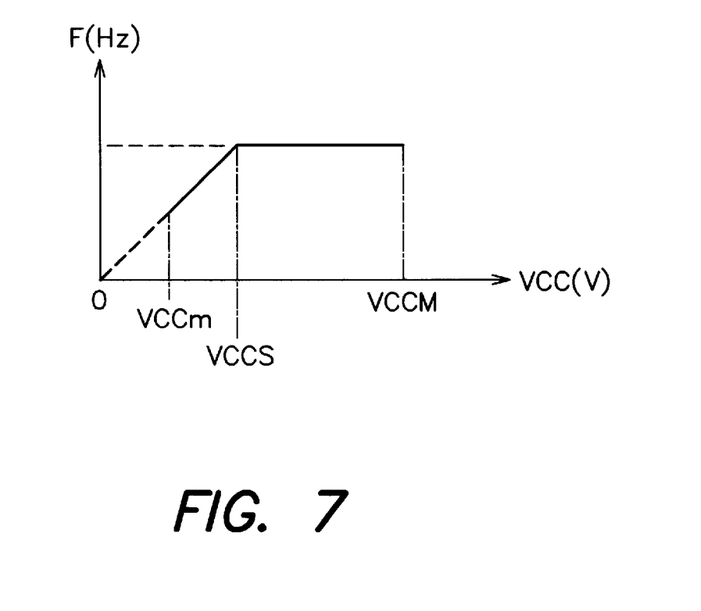
FIG. 7 shows the progress of the frequency of operation of the circuit of FIG. 6 as a function of the supply voltage.

FIG. 6 shows the general structure of a switch-over control circuit CDC that can be used to drive a load pump type high-voltage generator and which makes use of the oscillator OSC described here above with reference to FIG. 4. This control circuit can be used to obtain an operating frequency F whose progress as a function of the supply voltage VCC is shown in FIG. 7.

It shall be assumed that the supply voltage VCC can vary between a minimum value VCCm and a maximum value VCCM. For supply voltage VCC ranging from VCCm to a value VCCS below VCCM, the frequency F increases with the voltage VCC. Between VCCS and VCCM, the frequency F will be appreciably stable.

As a result, for a low supply voltage, the value of the frequency is the greatest frequency permissible, given the system being driven. It is then the system that controls the frequency of the oscillator retroactively. For a high supply voltage, the frequency is the frequency proper to the oscillator being used. Thus, it is possible to ensure optimum operation of the low-voltage pump while avoiding a racing of the value of the high-voltage frequency.

The circuit presented enables the driving of a load pump such as the one of FIG. 2, namely a circuit with several cascade-connected stages comprising transistors and capacitors with the switch-over control circuit producing four driving phases FX, FBX, FN, FBN (illustrated in FIGS. 3A to 3D). Of these four driving phases, FN and FX are two phases that are complementary but non-overlapping in the high state, switching over between two voltages that are substantially 0 volts (ground potential) and the supply voltage VCC. Additionally, FBN and FBX are two phases that are synchronized with FN and FX, respectively, and that switch over between two potentials which are substantially 0 and Vb, with Vb being greater, by at least Vt, than the voltage that the transistors must let through (Vt being the threshold voltage, in taking account of the substrate effect, of the transistors controlled by the phases FBN and FBX).

It will be said that FN and funciX are non-bootstrapped signals, FBN and FBX being bootstrapped signals so that the voltage which the transistors must let through can be exceeded by at least the value of Vt. It should be recalled that the term "bootstrapping" refers to the technique of producing a signal that is artificially raised over its normal value, generally by means of a capacitor that is precharged before being interposed in series between the signal to be bootstrapped and the terminal at which the bootstrapped signal must appear.

The switch-over control circuit CDC of FIG. 6 produces the four phases FN, FBN, FX and FBX.

The control circuit CDC includes the oscillator OSC providing the periodic signals CKX and CKN at a frequency F and two output stages ESX and ESN using the signals CKX and CKN, respectively, to produce the signals FX and FBX (output stage ESX) and the signals FN and FBN (output stage ESN). The signals CKX and CKN are, respectively, provided to the stage ESX and to the stage ESN by the oscillator OSC.

The output stages ESX and ESN furthermore produce the control signals CPX and CPN. The signal CPX produced by the stage ESX is provided to the oscillator OSC and to the output stage ESN. The signal CPN produced by the output stage ESN is provided to the oscillator OSC and to the output stage ESX.

Figure 8:
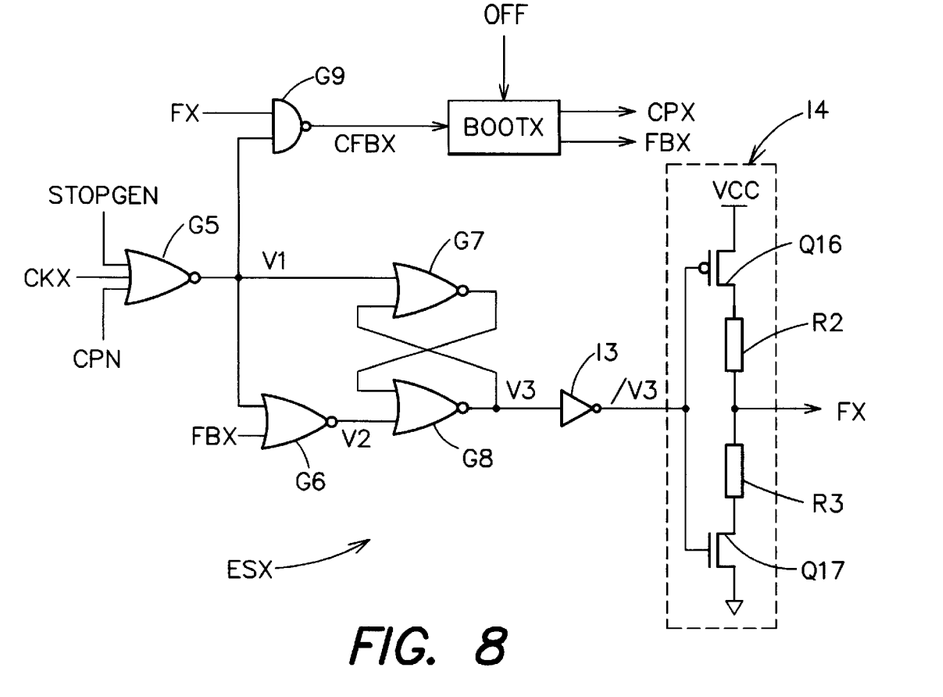
FIG. 8 shows a diagram of an output stage of the circuit illustrated in FIG. 6.

FIG. 8 illustrates an exemplary embodiment of the output stage ESX.

This output stage ESX receives the signals CKX and CPN and produces the signals FX, FBX and CPX. It furthermore receives logic signals STOPGEN and OFF.

The signal STOPGEN, when in a given logic state (the high state in the example being illustrated) enables activation of the stopping of the phase, in other words, the stopping of the production of the signals FX, FBX and CPX. These signals are then kept in a permanent logic state.

The OFF signal is used to stop the production of the signals FBX and CPX when it is in a given state (the high state in the example being illustrated) independently of the production of the signal FX. Signals FBX and CPX are then held in a permanent logic state.

Depending on the application being implemented, it is possible to use only one signal to enable the starting or stopping of the production of all the signals produced by the stage ESX. It is also possible to use only one signal to stop or start the oscillator and the output stages at the same time.

Hereinafter, it is only the output stage ESX that shall be described. To make the circuit illustrated in FIG. 6 and more particularly to make the output stage ESN, the circuits described for the output stage ESX shall be duplicated, in replacing the signals CKX, FX, FB, CPX and CPN respectively by the signals CKN, FN, FBN, CPN and CPX.

First of all, the production of the signal FX shall be described.

The output stage ESX includes a three-input NOR gate G5. This gate receives the signals STOPGEN, CKX and CPN and produces a logic signal V1. A two-input NOR gate G6 receives the signals V1 and FBX and produces a logic signal V2.

Two two-input NOR gates G7 and G8 form an RS flip-flop circuit receiving the signal V1 at its setting input and the signal V2 at its resetting input. The output of the RS flip-flop circuit provides a logic signal V3. This signal V3 is inverted by an inverter I3 that produces a logic signal /V3.

The signal /V3 is provided to an inverter I4. The inverter I4 produces the signal FX by inversion of the signal /V3. The inverter I4 is formed by an N channel MOS type transistor Q16, a P channel type MOS transistor Q17 and two resistors R2 and R3. The transistor Q16 receives the potential VCC at its source and the signal /V3 at its control gate with its drain connected to a first pole of the resistor R2. The transistor Q17 receives the ground potential at its source and the signal /V3 at its control gate with its drain connected to a first pole of the resistor R3. The second poles of each of the resistors R2 and R3 are connected to one another and provide the signal FX.

Using the resistors R2 and R3 makes it possible to limit noise on the supply potentials during switch-over operations and to limit the power consumption of the output stage ESX during state transitions in the signal /V3. Indeed, these state transitions in the signal are accompanied by a simultaneous transient conduction of the transistors Q16 and Q17. If transistors Q16 and Q17 are chosen to each have a substantial channel width, there is a greater response time during the transitions. If the value of supply voltage VCC is high, the transistors Q16 and Q17 then have low resistance and the resistors R2 and R3 can be used to limit the currents in the transistors during the simultaneous conduction. The values of the resistors R2 and R2 should be chosen such that they are negligible as compared with the values of resistances, in the on state, of the transistors Q16 and Q17 when the value of VCC is low (the resistance values of the transistors are then the maximum) so as not to slow down the response time of the inverter I4 at a low supply voltage. Thus, a relative independence of the response time with respect to the value of the supply voltage VCC is obtained since at least one resistive element in the inverter I4 is always taken into account (the resistors R2 and R3, if the value of VCC is high or the resistance of the transistors in the ON state if the value of VCC is low).

Let it be assumed initially that the signal STOPGEN is in the high state and that the signal FBX is in the low state. Signals V1 and FX are then each in the low state and the signal V2 is in the high state.

It shall be assumed first of all that the signal CPN, which is used to synchronize the working of the stage ESX with that of the stage ESN, is held in the low state. It shall also be assumed that the signal CKX is held in the high state which corresponds to a stopping of the oscillator OSC.

A modification of the states of the signals STOPGEN and CKX is necessary to modify the state of the signal FX. Let it be assumed that the oscillator OSC is put into operation and that, subsequently, the signal STOPGEN falls to the low state (the operation could, if necessary, be done in the reverse order). When the signal CKX falls to the low state, the signal V1 rises to the high state. The signal V2 then also falls to the low state. Consequently, the signal V3 rises to the high state. The signal /V3 then falls to the low state and the signal FX rises to the high state.

Conversely, when the signal CKX rises again to the high state, the signal V2 rises to the high state. The signal V3 will then fall back to the low state, thus subsequently causing the signal FX to fall to the low state. At the same time, the signal V1 has fallen back to the low state. The trailing edge that follows in the signal CKX leads to the rise to the high state of the signal V1 and the setting of the flip-flop circuit formed by the NOR gates G7 and G8.

Thus, there is produced a signal FX with the same frequency as the signal CKX but with opposite polarity. It is possible, if necessary, to produce signals of the same polarity by reversing the polarity of the signal FX at the output of the output stage ESX. It is also possible to reverse the polarity of the signal CKX received and modify the stage accordingly (typically by replacing the NOR type gates by NAND type gates and vice versa).

The signal FBX makes it possible to set the condition for the fall of the signal FX to the low state. Indeed, so long as the signal FBX is in the high state, the signal V2, which is used to reset the flip-flop circuit formed by the NOR gates G7 and G8, is held in the low state.

A description shall now be given of the production of the signals FBX and CPX.

The output stage ESX includes a two-input NAND gate G9. This gate receives the signals V1 and FX at its respective inputs and produces the logic signal CFBX. The signal CFBX is provided to a potential bootstrap circuit BOOTX that outputs the signals FBX and CPX.

Figure 9:
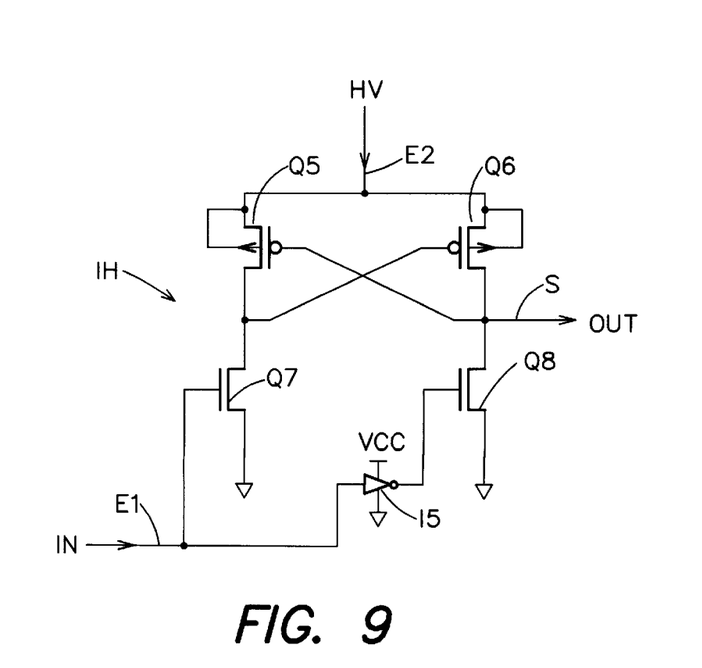
FIG. 9 shows a diagram of a potential translator circuit.

FIG. 9 shows a standard example of a logic potential translator circuit IH used in the circuit BOOTX.

The potential translator circuit IH has a control input E1, a supply input E2 and an output S. The input E1 is used to receive a logic signal IN and the output S provides an output logic signal OUT produced by the bootstrapping of the voltage of the signal IN when this signal is in the high state. The supply input E2 receives a high-voltage supply potential HV. The circuit IH enables the production, from a low-voltage logic signal (with a voltage for example of 3 volts when it is in the high state), of a logic signal at a higher voltage (for example 6 volts in the high state).

The circuit IH includes two P channel MOS type transistors Q5 and Q6 whose sources are each connected to the supply input E2. Circuit IH further includes two N channel MOS type transistors Q7 and Q8 whose sources are connected to ground. The control input E1 is connected, firstly, to the control gate of the transistor Q7 and, secondly, to an input of an inverter I5 whose output is connected to the control gate of the transistor Q8. The inverter I5 is supplied by a low-voltage supply potential (for example VCC), which is below the potential HV. The drains of the transistors Q5 and Q7 are connected to each other and to the control gate of the transistor Q6. The drains of the transistors Q6 and Q8 are connected to each other and to the control gate of the transistor Q5 and to the output S.

Let it be assumed that the circuit IH receives a signal IN which is at the ground potential. The transistors Q7 and Q8 are, respectively, off and on. The transistors Q5 and Q8 are, respectively, on and off. The signal OUT given at the output S is therefore at the ground potential.

If the circuit IH receives a signal IN that is at the positive potential VCC, but below the potential HV, then the transistors Q7 and Q8 are, respectively, on and off. The transistors Q5 and Q6 are, respectively, off and on and the signal OUT given at the output S is at the potential HV.

The circuit IH is thus a logic potential translator circuit.

Figure 10:
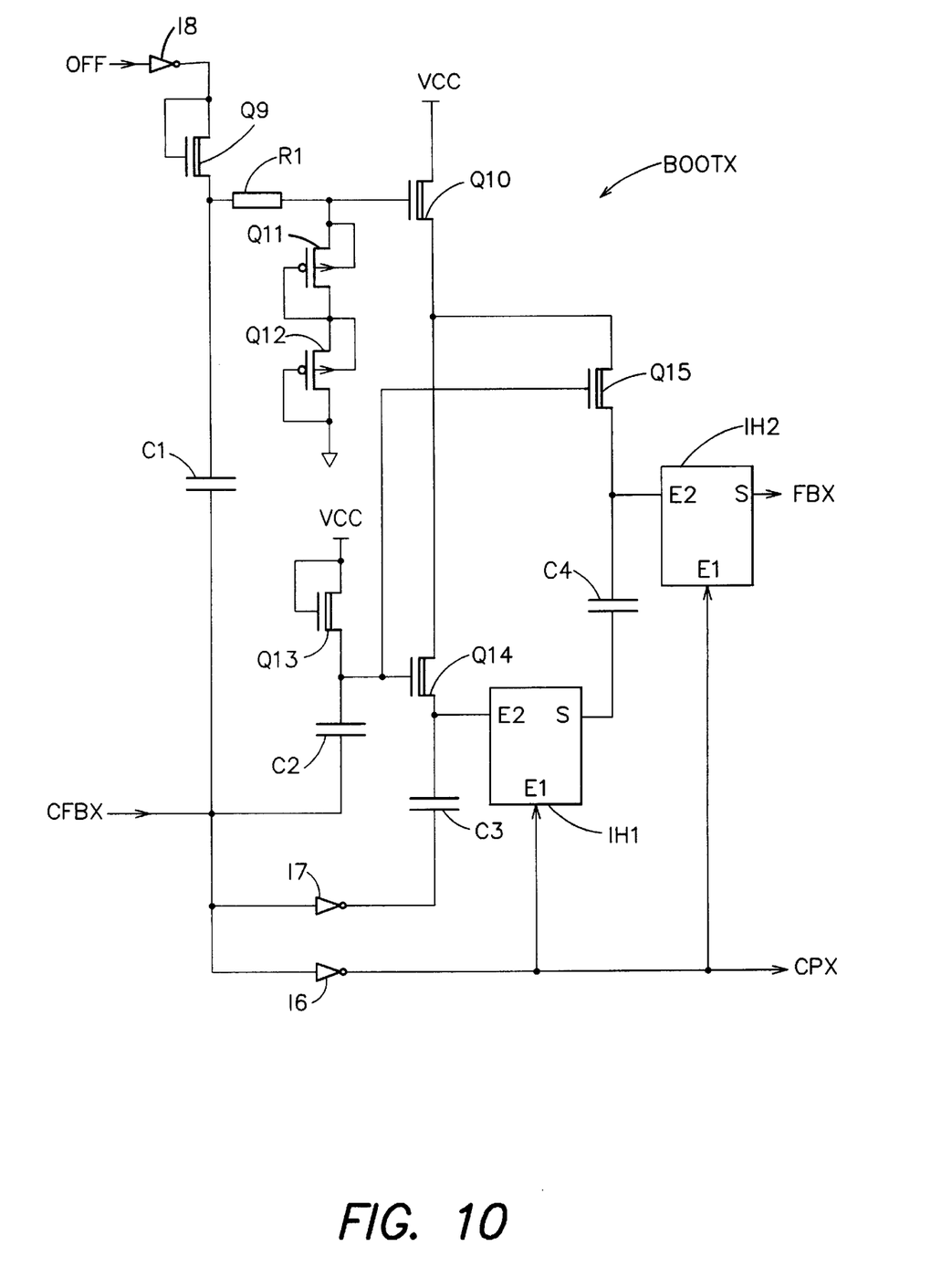
FIG. 10 shows a diagram of a potential bootstrap circuit.

FIG. 10 illustrates an exemplary embodiment of the potential bootstrap circuit BOOTX. The bootstrap circuit BOOTX receives the logic signals CFBX and OFF at first and second inputs and provides the logic signals CPX and FBX at first and second outputs, the signal FBX being a raised, i.e., bootstrapped, signal.

The bootstrap circuit BOOTX has two cascade-connected logic potential translator circuits IH1, IH2 the second circuit IH2 being cascade-supplied by the first circuit IH1 and the two circuits being driven by the same control signal CPX.

The supply of the logic potential translator circuits is provided by capacitors and a precharging device. The precharging device includes a precharging regulator used to limit the precharging potential of the capacitors to a maximum precharging value during precharging phases.

The potential of the signal FBX, when it is in the high state, is substantially equal to the potential of the signal CFBX when it is at the high state, plus twice the precharging potential. This precharging potential, in the example described, is equal to the supply potential VCC when this potential VCC is below a threshold and it is equal to the maximum precharging value when the potential VCC is greater than said threshold. In the example described, the potential is defined by the threshold voltages of diode-connected transistors.

The precharging of the capacitors is done by way of transistors behaving as diodes. These transistors provide for the precharging of the capacitors and prevent the discharging of These capacitors when the bootstrapped output potential is produced during the bootstrapping phases.

The signal CFBX is provided to two inverters I6 and I7. The inverter I6 provides the signal CPX by inversion of the signal CFBX. The signal CPX is used as a control signal for the two logic potential translator circuits IH1, IH2 each identical to the circuit IH1 shown in FIG. 9. These circuits each receive the signal CPX at their respective input E1.

A first capacitor C1 has a first pole receiving the signal CFBX. A second pole of capacitor C1 receives the signal OFF by way of an inverter I8 and a transistor Q9, which is a diode-connected N channel MOS transistor. This second pole is also connected to a first pole of a resistor R1. A second pole of this resistor R1 is connected to the control gate of an N channel MOS type transistor Q10 which receives the potential VCC at its drain. The second pole of the resistor R1 is furthermore connected to ground by means of two diode-connected P channel MOS type transistors Q11 and Q12 connected in series to one another.

A second capacitor C2 has a first pole receiving the signal CFBX. A second pole of the second capacitor C2 receives the potential VCC through a transistor Q13 which is a diode-connected N channel MOS type transistor. This second pole is also connected to the control gates of two N channel MOS type transistors Q14 and Q15 whose drains are each connected to the source of the transistor Q10. The source of the transistor Q14 is connected, firstly, to the output of the inverter I7 through a third capacitor C3 and, secondly, directly to the input E2 of the circuit IH1.

The third capacitor C3 has a first pole which is connected to the output of the inverter I7 and a second pole which is connected to the source of the transistor Q14. The source of the transistor Q15 is connected, firstly, to the output S of the circuit IH1 through a fourth capacitor C4 and, secondly, directly to the input E2 of the circuit IH2.

The fourth capacitor C4 has a first pole which is connected to the output S of the circuit IH1 and a second pole which is connected to the source of the transistor Q15. The output S of the circuit IH2 provides the signal FBX.

Preferably, the N channel MOS type transistors of the circuit BOOTX will be socalled native transistors (namely without threshold doping) with low threshold voltage so as to limit the losses in these transistors and so as to enable the use of the circuit with a low supply voltage.

A description shall now be given of the operation of the circuit BOOTX.

The assembly formed by the inverter I8, the resistor R1 and the transistors Q9, Q11 and Q12 enables the gate voltage of the transistor Q10 to be limited to 2* Vtp (in the range of 3 volts, assuming that the transistors Q11 and Q12 have a threshold voltage Vtp in the range of 1.5 volts). This makes it possible to limit an amplitude of the signal FBX when the voltage VCC is high, by limiting the precharging potential of the capacitors C3 and C4. The use of the circuit BOOTX to control the transfer of charges in a load pump averts a risk of destruction of the gates of the transistors controlled by the bootstrapped signals FBX and FBN.

When the signal CFBX is in the low state, the first pole of the capacitor C1 is at the potential VCC−Vtnat$_9$ where Vtnat$_9$ refers to the threshold voltage of the transistor Q9. The transistor Q10 is then off.

When the signal CFBX rises to the high state (it is then electrically at the supply potential VCC), the second pole of the capacitor C1 rises to the potential 2*VCC−Vtnat$_9$. The potential of the control gate of the transistor Q10 rises to 2*Vtp, assuming that 2*VCC−Vtnat$_9$ is greater than 2*Vtp. The second poles of each of the capacitors C3 and C4 are then precharged to 2*Vtp−Vtnat$_9$ (if 2*Vtp−Vtnat$_9$<VCC), or to VCC (if 2*Vtp−Vtnat$_9$>VCC) by what the transistors Q10, Q14 and Q15, assuming that the losses in the transistors Q14 and Q15 are zero.

If it is assumed that Vtp=3 V and that Vtnat$_9$=0.1 V, then the precharging voltage can be regulated for a minimum value of VCC as a low voltage in the range of 1.6 V. Then, VCC is transferred to the second poles of the capacitors C3 and C4.

The transistor Q10 acts as a regulator of potential for precharging the capacitors C3 and C4. The transistors Q14 and Q15 behave as diodes. The transistors Q14 and Q15 firstly provide for the precharging of the capacitors C3 and C4 when the signal CFBX is in the high state and, secondly, prevent the parasitic discharging of these capacitors in the precharging circuits when the signal CFBX is in the low state (temporarily corresponding, as shall be seen hereinafter, to the production of the bootstrapped signal FBX).

The transistor Q13 and the capacitor C2 enable the increasing of the voltage of the control gates of the transistors Q14 and Q15 so as to prevent losses due to the threshold voltages during the precharging phase.

When the signal CFBX is in the low state, the potential at these control gates is equal to VCC−Vtnat$_{13}$, where Vtnat$_{13}$ denotes the threshold voltage of the transistor Q13. This potential is lower than VCC and is at 2*Vtp if 2*Vtp−Vtnat$_{13}$<VCC. The transistors Q14 and Q15 are then off.

When the signal CFBX is in the high state, this potential is equal to 2*VCC Vtnat$_{13}$. The transistors Q14, Q15 are then on.

When the signal CFBX falls to the low state, the potential at the first pole of the capacitor C3 is equal to VCC and its second pole rises to the potential VCC+2*Vtp−Vtnat$_{13}$ (if 2*Vtp−Vtnat$_{13}$<VCC) or 2*VCC (if 2*Vtp−Vtnat$_{13}$>VCC).

The circuit IH1 then tales the potential at the first pole of the capacitor C4 to VCC+2*Vtp−Vtnat$_{13}$ (if 2*Vtp−Vtnat$_{13}$<VCC) or 2*VCC (if 2*Vtp−Vtnat$_{13}$>VCC).

The second pole of the capacitor C4 then increases to the potential VCC+2*Vtp−Vtnat$_{13}$+2*Vtp−Vtnat$_{13}$ (if 2*Vtp−Vtnat$_{13}$<VCC) or 2*VCC+VCC (if 2*Vtp−Vtnat$_{13}$>VCC), i.e. to VCC+4*Vtp−2*Vtnat$_{13}$ or to 3*VCC, and this potential is output at the output S of the circuit IH2.

Since both potential translator circuits IH1, IH2 are controlled by the same signal CPX, the increasing of the signal FBX to the high state is done in two phases.

When the signal CPX rises to the high state, the outputs S of the circuits IH1 and IH2 are insulated from ground and connected to their respective inputs E2. The switch-over of the transistors internal to the bootstrap circuits is not instantaneous. There exists a transient phase of simultaneous conduction of the series-connected transistors in the logic level bootstrap circuits. Consequently, the bootstrapping of the potential supplying the circuit IH2 is not immediate. The output potential of the circuit IH2 will initially rise to 2*Vtp−Vtnat$_{13}$ (or VCC if 2*Vtp−Vtnat$_{13}$>VCC) before rising to VCC+4*Vtp−2*Vtnat (or 2*Vcc if 2*Vtp−Vtnat$_{13}$>VCC).

Since the supply potential of the circuit IH2 in a switch-over phase is limited, the losses in the capacitor C4, when the transistors of the circuit IH2 are simultaneously in a state of conduction, are also limited.

Capacitors C3 and C4 are chosen with values such that the bootstrapping of the voltages at the terminals of these capacitors is fast, as shall be seen hereinafter.

The output signal of the circuit IH2, in other words the signal FBX, oscillates between 0 volts (ground potential) and VCC+4*Vtp−2*Vtnat$_{13}$ (or 3*VCC if VCC<2*Vtp−Vtnat$_{13}$) depending on whether the signal CFBX is in the high state or the low state.

In view of the various losses, which are due inter alia to the switch-over of the circuit IH1 and various parasitic capacitances, the final value obtained under no-load operation is slightly smaller, i.e., in the range of 1.5 V.

As a next example, let it be assumed that Vtnat is in the range of 0.1 volts and that Vtp is in the range of 1.5 volts.

For VCC=1.6 V, a theoretical amplitude of 4.8 volts (3*VCC) is obtained at the signal FBX. In practice, in view of the losses in the transistors, it is possible to reach a value in the range of 4.5 V.

For VCC=5 V, a theoretical amplitude of 10.5 volts (VCC+4*Vtp−2*Vtnat$_{13}$) is obtained on the signal FBX. In practice, given the losses, it is possible to reach a value of about 9 volts.

Thus, for a variation in the value of VCC that is greater than a factor of 3, there is obtained a variation in the value of the bootstrapped potential which is firstly lower than a factor of 2 and secondly limited for a value of VCC greater than a threshold of 2*Vtp−Vtnat$_{13}$ (the bootstrapping equal to 4*Vtp−2*Vtnat$_{13}$ being then substantially constant).

Operation of the switch-over control circuit at maximum frequency will now be discussed. This operation corresponds in FIG. 7 to VCC ranging from VCCS to VCCM.

Let it be assumed that the oscillator OSC is put into operation. The signals CPX and CPN make it possible, if necessary, to reduce the frequency of the signals CKX and CKN. These signals CPX and CPN rise to the high state, permitting a modification of the state of the outputs of the gates G1 and G2 when the signals FBX and FBN are in the high state.

Let us next consider the signal FX. In order that it may rise to the high state, the signals CKX, CPN and FBX should be in the low state. Thus, it is ensured, firstly, that the signals FX and FN are not simultaneously in the high state and, secondly, that the signal FBN is not in the high state.

The passage of the signal CKX to the low state causes the signal FX to rise to the high state by the setting of the flip-flop circuit formed by the gates G7 and G8. This rise leads to the fall to the low state of the signal CFBX at the output of the gate G9. This descent induces the rising of the signals CPX and FBX to the high state. With the signal FBX being raised to the high state, it is then possible to permit the modification of the state of the signal CKX by means of the gate G3 of the oscillator.

The subsequent fall of the signal CKX to the low state causes the rising of the signal CFBX to the high state. The signals CPX and FBX will therefore fall back to the low state. The flip-flop circuit formed by the gates G7 and G8 is then reset and the signal FX falls back to the low state.

For the signals FN, CPN and FBN, the process is similar, the non-overlapping of the signals CKN and CKX ensuring that there is a non-overlapping of the pairs of signals (FX, FBX) and (FN, FBN).

Operation of the switch over control circuit at limited frequency as a function of VCC will now be discussed. This operation corresponds in FIG. 7 to VCC ranging from VCCm to VCCS.

When the frequency of the oscillator is excessively high, the output stages ESX and ESN cannot follow this oscillator and the high state of the signals FBX and FBN is not ensured. In this case, in practice, the operations for charging the capacitors CX and CN of the oscillator are faster than the rising to the high state of the signals FBX and FBN. These charging operations are taken into account only after the signals CPX and CPX have risen to the high state, which corresponds to a high state of the signals FBX and FBN. Thus, the frequency of the oscillator is limited.

Capacitors C3 and C4 are chosen to have values such that the bootstrapping of the voltage at the terminals of these capacitors is fast. Indeed, it must be ensured that the increasing of the signals FBX and FBN to their maximum potential is achieved before the capacitors CX and CN of the oscillator OSC have been discharged. This then causes these signals to fall back. Indeed, the discharging of the capacitors CX and CN is controlled not directly by the signals FBX and FBN but by the signals CPX and CPN which are produced in parallel with the signals FBX and FBN.

In practice, however, this limiting of the values of the capacitors C3 and C4 is not a source of inconvenience, for the control of the transistors of a load pump is achieved in voltage and does not require high current (all that needs to be done is to charge the parasitic capacitors such as the capacitors of the gates of the MOS type transistors).

Although an exemplary switch-over control circuit producing bootstrapped phases has been described, it is of course possible to use the oscillator to control a load pump such as the one shown in FIG. 1. It is possible similarly to simplify the circuit described by not furnishing any validation signals CPX and CPN to the oscillator. This will be possible if the value of the potential VCC does not vary, or varies little, and enables operation at maximum frequency without any risk of blockage. Finally, it is possible of course, without going beyond the scope of the present invention, to modify the circuits described and use, for example, signals with reversed polarity, or else again to use logic gates of different types.

Having thus described at least one illustrative embodiment of the present invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power supply for supplying an output voltage greater than an input voltage, the supply comprising:

an oscillator circuit to produce first and second oscillating logic signals that are of a same frequency and are not each in a first logic state at a same time;

a first output stage coupled to the oscillator circuit to provide first and second driving signals and a first control signal as a function of the first oscillating logic signal;

a second output stage coupled to the oscillator circuit and the first output stage, the second output stage to produce third and fourth driving signals and a second control signal as a function of the second oscillating logic signal; and the first and second control signals being coupled to the oscillator, the first control signal being coupled to the second output stage.

2. A power supply for supplying an output voltage greater than an input voltage, the supply comprising:

an oscillator circuit to produce first and second oscillating logic signals that are of a same frequency and are not each in a first logic state at a same time;

a first output stage coupled to the oscillator circuit to provide first and second driving signals and a first control signal as a function of the first oscillating logic signal;

a second output stage coupled to the oscillator circuit and the first output stage, the second output stage to produce third and fourth driving signals and a second control signal as a function of the second oscillating logic signal;

the first and second output stages each comprising:

a first circuit to receive the first oscillating logic signal, the second control signal and the first and second driving signals and to output first, second and third intermediate signals;

a bootstrap circuit to receive the first intermediate signal and to produce the first driving signal and the first control signal each as a function of the first intermediate signal;

a flip-flop circuit having first and second inputs to receive, respectively, the second and third intermediate signals and to output a fourth intermediate signal as a function thereof; and an inverter circuit to receive the fourth intermediate signal and to output the second driving signal as a function thereof.

3. The power supply as recited in claim 2, wherein the bootstrap circuit comprises:

a first circuit to receive the first intermediate signal and to produce first and second voltage potentials;

an inverter having an input to receive the first intermediate signal and to output the first control signal;

a first logic potential translator circuit to receive the first voltage potential and the output of the inverter and to output a first potential voltage as a function thereof;

a capacitor having a first pole connected to the output of the first logic potential translator circuit and a second pole coupled to receive the second voltage potential from the first circuit; and a second logic potential translator circuit coupled to receive the second voltage potential and the output of the inverter so as to produce the first driving signal as a function thereof.

4. The power supply as recited in claim 3, wherein the first and second logic potential translator circuits each comprises:

first and second input terminals;

an output terminal;

first and second transistors series connected between the first input terminal and a first reference potential;

third and fourth transistors series coupled between the first input terminal and the first reference potential, a control terminal of the third transistor connected to the second input terminal;

an inverter having an input connected to the second input terminal and an output connected to a control terminal of the fourth transistor;

wherein, the first and third transistors are each of a first type and each connected as a diode;

wherein, the second and fourth transistors are each of a second type;

wherein a control terminal of the third transistor is connected to a node between the first and second transistors; and wherein a control terminal of the first transistor is connected to a node between the third and fourth transistors and to the output terminal.

5. A power supply for supplying an output voltage greater than an input voltage, the supply comprising:

means for producing first and second oscillating logic signals that are of a same frequency and are not each in a first logic state at a same time;

first means, coupled to the logic signal producing means, for producing first and second driving signals and a first control signal as a function of the first logic signal;

second means, coupled to the driving signal producing means and the logic signal producing means, for producing third and fourth driving signals and a second control signal as a function of the second logic signal; and the first and second control signals being coupled to the oscillator, the first control signal being coupled to the second output stage.

6. The power supply according to claim 1, the oscillator comprising:

a flip-flop circuit to produce third and fourth oscillating logic signals of opposite polarities, the flip-flop circuit being driven by first and second driving logic signals;

first and second logic gates receiving the third and fourth logic signals, respectively, and producing the first and second oscillating logic signals, logic state transitions in the first and second oscillating logic signals being produced as a function of logic state transitions of the third and fourth logic signals, and the first and second logic gates being organized so as to introduce a delay into the logic state transitions to a second logic state to the first logic state in the first and second oscillating logic signals, with respect to transitions in the third and fourth logic signals; and first and second RC type circuits each coupled to the flip-flop circuit, to respectively produce the first and second driving logic signals to control the transitions in the third and fourth logic signals.

7. The oscillator circuit according to claim 6, wherein the first and second logic gates producing the first and second oscillating logic signals are Schmitt triggers receiving, respectively, the third and fourth logic signals.

8. The oscillator circuit according to claim 6, wherein the first and second RC type circuits each comprises an integrator producing a voltage from one of the first and second oscillating logic signals, and wherein a third logic gate that is sensitive to a value of the produced voltage produces one of the first and second driving signals, logic states of the respective driving signal representing a value of the produced voltage.

9. The oscillator circuit according to claim 8, wherein the third logic gate is controlled by a control signal enabling changes in a logic state of the respective first and second driving signals to be delayed.

10. The oscillator circuit according to claim 6, wherein the first and second RC type circuits each have different time constants so as to produce, respectively, first and second logic signals having different duty cycles.

* * * * *